US010305055B2

(12) United States Patent
Oooka et al.

(10) Patent No.: US 10,305,055 B2
(45) Date of Patent: May 28, 2019

(54) PHOTOELECTRIC CONVERSION DEVICE AND MANUFACTURING METHOD THEREOF

(71) Applicant: Kabushiki Kaisha Toshiba, Minato-ku (JP)

(72) Inventors: Haruhi Oooka, Kawasaki (JP); Hideyuki Nakao, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/788,964

(22) Filed: Oct. 20, 2017

(65) Prior Publication Data

US 2018/0062099 A1    Mar. 1, 2018

Related U.S. Application Data

(62) Division of application No. 15/070,264, filed on Mar. 15, 2016, now Pat. No. 9,899,618.

(30) Foreign Application Priority Data

Mar. 19, 2015   (JP) .................................. 2015-056141

(51) Int. Cl.
  *H01L 51/44*    (2006.01)
  *H01L 27/30*    (2006.01)
  *H01L 51/00*    (2006.01)

(52) U.S. Cl.
  CPC .......... *H01L 51/442* (2013.01); *H01L 27/301* (2013.01); *H01L 51/0023* (2013.01);
  (Continued)

(58) Field of Classification Search
  CPC ....................... H01L 31/046; H01L 31/04–049
  (Continued)

(56) References Cited

U.S. PATENT DOCUMENTS

| 4,443,651 A * | 4/1984 | Swartz ................ H01L 31/0465 136/244 |
| 5,217,921 A * | 6/1993 | Kaido ................... H01L 31/046 257/E27.125 |

(Continued)

FOREIGN PATENT DOCUMENTS

| EP | 2 572 798 A2 | 3/2013 |
| JP | 9-185074 | 7/1997 |

(Continued)

OTHER PUBLICATIONS

Office Action dated Mar. 8, 2016 in Japanese Patent Application No. 2015-056141 (w/English language translation).

*Primary Examiner* — Niki Bakhtiari
(74) *Attorney, Agent, or Firm* — Oblon, McClelland, Maier & Neustadt, L.L.P.

(57) ABSTRACT

A photoelectric conversion device of an embodiment includes: a first photoelectric conversion part including a first transparent electrode, a first organic active layer, and a first counter electrode; and a second photoelectric conversion part including a second transparent electrode, a second organic active layer, and a second counter electrode, which are provided on a transparent substrate. A conductive layer is formed on a partial region, of the second transparent electrode, which is adjacent to the first transparent electrode. The first counter electrode and the second transparent electrode are electrically connected by a connection part including a groove formed from a surface of the second organic active layer to reach an inside of the conductive layer and a part of the first counter electrode filled in the groove.

6 Claims, 6 Drawing Sheets (52) U.S. Cl.
CPC .... *H01L 51/0043* (2013.01); *H01L 2251/308* (2013.01); *Y02E 10/549* (2013.01); *Y02P 70/521* (2015.11)

(58) Field of Classification Search
USPC ........................................................ 136/256
See application file for complete search history.

(56) References Cited

U.S. PATENT DOCUMENTS

| | | | |
|---|---|---|---|
| 5,956,572 | A | 9/1999 | Kidoguchi et al. |
| 7,982,130 | B2 | 7/2011 | Forrest |
| 2009/0314337 | A1 | 12/2009 | Lee et al. |
| 2010/0258167 | A1* | 10/2010 | Chang ............. H01L 31/022425 136/254 |
| 2012/0204931 | A1 | 8/2012 | Seike |
| 2013/0074766 | A1 | 3/2013 | Saeki et al. |
| 2014/0060617 | A1* | 3/2014 | Miyashita ............. H01L 31/046 136/244 |

FOREIGN PATENT DOCUMENTS

| | | |
|---|---|---|
| JP | 10-70295 | 3/1998 |
| JP | 2001-237442 | 8/2001 |
| JP | 2010-212336 | 9/2010 |
| JP | 2013-66873 | 4/2013 |
| JP | 2013-211473 | 10/2013 |
| JP | 2014-49655 | 3/2014 |
| JP | 2014-120643 | 6/2014 |

* cited by examiner

PHOTOELECTRIC CONVERSION DEVICE AND MANUFACTURING METHOD THEREOF

CROSS REFERENCE TO RELATED APPLICATION

This application is a division of and claims the benefit of priority under 35 U.S.C. § 120 from U.S. application Ser. No. 15/070,264 filed Mar. 15, 2016, and claims the benefit of priority under 35 U.S.C. § 119 from Japanese Patent Application No. 2015-056141 filed Mar. 19, 2015; the entire contents of each of which are incorporated herein by reference.

FIELD

Embodiments disclosed herein relate generally to a photoelectric conversion device and a manufacturing method thereof.

BACKGROUND

The application of organic semiconductors to photoelectric conversion devices such as a photovoltaics, a light emitting element, and a photosensor is being expected. Using an organic semiconductor as a forming material of an active layer of a photovoltaics and the like makes it possible to employ an inexpensive coating method for forming the active layer and the like, and thus enables a great reduction of a formation cost of the active layer and the like. Because of these points, an organic photovoltaics and an organic/inorganic hybrid photovoltaics which use an organic semiconductor are expected as a next-generation photovoltaics that cost low and are harmless.

Cells forming a photovoltaic module each have a structure in which an active layer is sandwiched by a transparent electrode and a counter electrode. A transparent electrode on a practical level does not have sufficient conductivity, and accordingly efficiency for extracting generated electric charges deteriorates as a cell area is increased. As a forming material of the transparent electrode, a conductive metal oxide, a conductive polymer, a carbon material, or the like is used, and further, a material in which a metal nanowire or the like is compounded with any of these is used. In a photovoltaic module, generally, a plurality of strip-shaped cells are arranged and the plural cells are connected in series.

A photovoltaic module having a plurality of cells is formed by the following method, for instance. Transparent electrodes of the respective cells are formed on a transparent substrate. An organic active layer is formed on the whole surface of the plural transparent electrodes by coating. Part of the organic active layer is scribed, whereby grooves from which the transparent electrodes are exposed are formed. Counter electrodes are formed on the organic active layer having the scribe grooves so as to correspond to the respective cells. At this time, in the scribe groove, the counter electrode of the adjacent cell is filled, so that the counter electrode of the adjacent cell is electrically connected with the transparent electrode exposed in the scribe groove.

The scribing of the organic active layer is executed by mechanical scribing using a cutting tool, for instance. In a case where a conductive metal oxide is used as the transparent electrode, a hard transparent conductive oxide layer exists under the soft organic active layer, and thus at the time of the mechanical scribing of the organic active layer, the organic active layer is likely to remain on the conductive metal oxide. The organic active layer, if remaining on the conductive metal oxide, increases electrical resistance between the transparent electrode and the counter electrode of the adjacent cell, resulting in deterioration of power conversion efficiency. Increasing a scribing pressure so as to prevent the organic active layer from remaining is likely to cause a crack or the like in the transparent conductive oxide layer. In a case where a conductive polymer is used as the transparent electrode, the transparent electrode has the same softness as that of the organic active layer, which makes it difficult to selectively scribe the organic active layer so that the conductive polymer remains without the organic active layer remaining.

The above circumstances have given rise to a demand for an art to improve electrical connectivity between the adjacent cells (photoelectric conversion parts) by achieving both the prevention of the organic active layer from remaining on the transparent electrodes and the prevention of breakage of the transparent electrodes at the time of the mechanical scribing of the organic active layer.

DETAILED DESCRIPTION

According to one embodiment, there is provided a photoelectric conversion device including: a transparent substrate; a first photoelectric conversion part including a first transparent electrode provided on the transparent substrate, a first organic active layer disposed on the first transparent electrode, and a first counter electrode disposed on the first organic active layer; a second photoelectric conversion part including a second transparent electrode disposed on the transparent substrate adjacently to the first transparent electrode and electrically insulated from the first transparent electrode, a conductive layer formed on a partial region of the second transparent electrode, the partial region being adjacent to the first transparent electrode, a second organic active layer disposed on the second transparent electrode, and a second counter electrode disposed on the second organic active layer; and a connection part including a groove formed from a surface of the second organic active layer to reach an inside of the conductive layer and a part of the first counter electrode filled in the groove and which electrically connects the first counter electrode and the second transparent electrode via the conductive layer.

Hereinafter, a photoelectric conversion device of an embodiment and a manufacturing method thereof will be described with reference to the drawings. Note that, in each embodiment, substantially the same constituent parts are denoted by the same reference signs and a description thereof will be partly omitted in some case. The drawings are schematic, and a relation of thickness and planar dimension, a thickness ratio among parts, and so on are sometimes different from actual ones. Terms indicating up and down directions and so on in the description indicate relative directions when a surface, of the later-described transparent substrate, where to form the photoelectric conversion parts is defined as an up direction, unless otherwise noted, and they are sometimes different from actual directions based on a gravitational acceleration direction.

Figure 1:
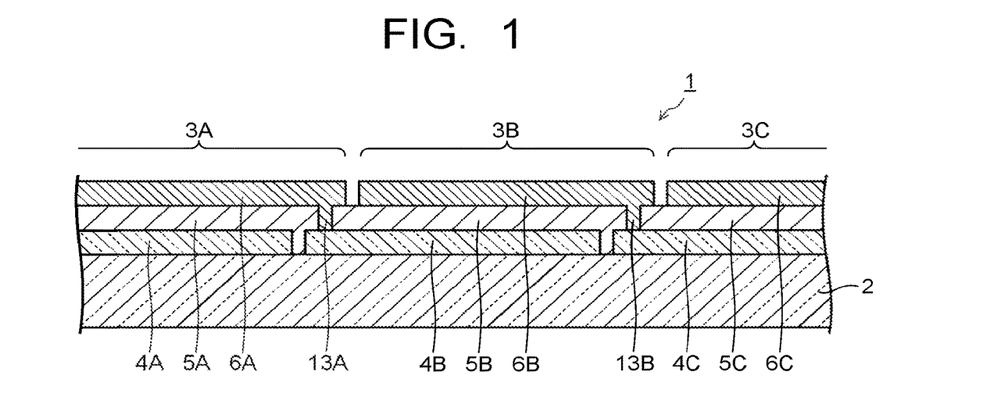
FIG. 1 is a sectional view illustrating a schematic structure of a photoelectric conversion device according to an embodiment.

FIG. 1 illustrates a schematic structure of the photoelectric conversion device of the embodiment. The photoelectric conversion device 1 illustrated in FIG. 1 includes a transparent substrate 2 functioning as a support substrate and a plurality of photoelectric conversion parts 3 (3A, 3B, 3C) disposed on the transparent substrate 2. The photoelectric conversion parts 3 each include a transparent electrode 4 (4A, 4B, 4C), a photoelectric conversion layer 5 (5A, 5B, 5C), and a counter electrode 6 (6A, 6B, 6C) which are formed on the transparent substrate 2 in the order mentioned.

The transparent substrate 2 is formed of a material having a light transmitting property and insulation performance. As the constituent material of the transparent substrate 2, an inorganic material such as non-alkali glass, quartz glass, or sapphire, or an organic material such as polyethylene (PE), polyethylene terephthalate (PET), polyethylene naphthalate (PEN), polyimide, polyamide, polyamide-imide, or a liquid crystal polymer is used. For example, the transparent substrate 2 may be a rigid substrate formed of an inorganic material or an organic material, or may be a flexible substrate formed of an organic material or a very thin inorganic material.

In the photoelectric conversion device 1 of the embodiment, the photoelectric conversion layer 5 is irradiated with light through the transparent substrate 2 and the transparent electrode 4. Or, light generated in the photoelectric conversion layer 5 is emitted through the transparent substrate 2 and the transparent electrode 4. In a case where the photoelectric conversion device 1 is a photovoltaics, charge separation is caused by the light irradiating the photoelectric conversion layer 5, so that electrons and holes are generated. Out of the electrons and the holes generated in the photoelectric conversion layer 5, for example, the electrons are collected in the transparent electrode 4, and the holes are collected in the counter electrode 6. The functions of the transparent electrode 4 and the counter electrode 6 may be reversed. Hereinafter, these parts will be described.

The transparent electrode 4 is formed of a material having a light transmitting property and conductivity. As the constituent material of the transparent electrode 4, a conductive metal oxide such as indium oxide, zinc oxide, tin oxide, indium tin oxide (ITO), fluorine-doped tin oxide (FTO), gallium-doped zinc oxide (GZO), aluminum-doped zinc oxide (AZO), indium-zinc oxide (IZO), and indium-gallium-zinc oxide (IGZO); a conductive polymer such as poly(3,4-ethylenedioxythiophene)/poly(4-styrenesulfonate) (PEDOT/PSS); and a carbon material such as graphene are usable. A material in which a nano conductive material such as a silver nano wire, a gold nano wire, or a carbon nanotube is mixed in any of the aforesaid materials is also usable.

Further, the transparent electrode 4 may be a film stack of a layer formed of any of the aforesaid materials and a metal layer formed of metal such as gold, platinum, silver, copper, cobalt, nickel, indium, or aluminum, or an alloy containing any of these metals, within a range capable of maintaining the light transmitting property. The transparent electrode 4 is formed by, for example, a vacuum deposition method, a sputtering method, an ion plating method, a CVD method, a sol gel method, a plating method, a coating method, or the like.

A thickness of the transparent electrode 4 is not particularly limited, but is preferably not less than 10 nm nor more than 1 μm, and more preferably not less than 30 nm nor more than 300 nm. When the film thickness of the transparent electrode 4 is too thin, sheet resistance becomes high. When the film thickness of the transparent electrode 4 is too thick, light transmittance decreases, and further flexibility decreases, so that a crack or the like is likely to occur due to a mechanical stress. It is preferable to select the film thickness of the transparent electrode 4 so that high light transmittance and low sheet resistance are both obtained. The sheet resistance of the transparent electrode 4 is not particularly limited, but is generally 1000 Ω/□ or less, more preferably 500 Ω/□ or less, and still more preferably 200 Ω/□ or less. In a case of a current driven type such as a photovoltaics and a light emitting element, 50 Ω/□ or less is more preferable.

Figure 2:
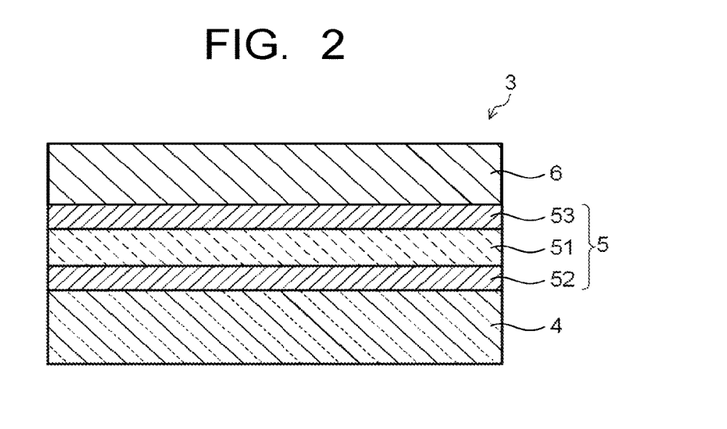
FIG. 2 is an enlarged sectional view illustrating a photoelectric conversion part in the photoelectric conversion device illustrated in FIG. 1.

The photoelectric conversion layer 5 has an organic active layer 51, a first intermediate layer (first buffer layer) 52 disposed between the transparent electrode 4 and the organic active layer 51, and a second intermediate layer (second buffer layer) 53 disposed between the organic active layer 51 and the counter electrode 6, as illustrated in FIG. 2. The intermediate layers 52, 53 are disposed when necessary, and in some case, both or one of the intermediate layers 52, 53 may be omitted. The layers 51, 52, 53 forming the photoelectric conversion layer 5 are appropriately selected according to a device (a photovoltaics, a light emitting element, a photosensor, or the like) to which the photoelectric conversion device 1 is applied. Hereinafter, a case where the photoelectric conversion device 1 is used as a photovoltaics will be mainly described, but the photoelectric conversion device 1 of the embodiment is applicable to a light emitting element, a photosensor, and the like.

In a case where the photoelectric conversion device 1 of the embodiment is applied to an organic photovoltaics, the organic active layer 51 contains, for example, a p-type semiconductor and an n-type semiconductor. As the p-type semiconductor in the organic active layer 51, a material having an electron donating property is used, and as the n-type semiconductor, a material having an electron accepting property is used. The p-type semiconductor and the n-type semiconductor forming the organic active layer 51 both may be organic materials or one of them may be an organic material.

As the p-type semiconductor contained in the organic active layer 51, polythiophene and its derivative, polypyrrole and its derivative, a pyrazoline derivative, an arylamine derivative, a stilbene derivative, a triphenyldiamine derivative, oligothiophene and its derivative, polyvinyl carbazole and its derivative, polysilane and its derivative, a polysiloxane derivative having aromatic amine at a side chain or a main chain, polyaniline and its derivative, a phthalocyanine derivative, porphyrin and its derivative, polyphenylene vinylene and its derivative, polythienylene vinylene and its derivative, and the like are usable. These materials may be used in combination, or a mixture or a compound of any of these materials and another material may be used.

As the p-type semiconductor, polythiophene being a conductive polymer having a π-conjugated structure and its derivative are preferably used. Polythiophene and its derivative have excellent stereoregularity and are relative high in solubility in a solvent. Polythiophene and its derivative are not particularly limited, provided that they are each a compound having a thiophene framework. Specific examples of polythiophene and its derivative are: polyalkylthiophene such as poly(3-methylthiophene), poly(3 -butylthiophene), poly(3-hexylthiophene), poly(3-octylthiophene), and poly(3 -decylthiophene); polyarylthiophene such as poly(3-phenylthiophene) and poly(3 -(p-alkylphenylthiophene)); polyalkylisothionaphthene such as poly(3-butylisothionaphthene), poly(3-hexylisothionaphthene), poly(3-octylisothionaphthene), and poly(3 -decylisothionaphthene); polyethylenedioxythiophene; poly[N-9'-heptadecanyl-2,7 -carbazole-alt-5,5-(4,7-di-2-thienyl-2',1',3'-benzothiadiazole)] (PCDTBT); poly[4,8 -bis {(2-ethylhexyl)oxy}benzo[1,2-b:4,5-b']dithiophene-2,6-diyl-1t-alt-3-fluoro-2-{(2 -ethylhexyl)carbonyl)}thieno[3,4-b]thiophene-4,6-diyl] (PTB7); and so on.

As the n-type semiconductor contained in the organic active layer 51, fullerene, a fullerene derivative, or the like is used. The fullerene derivative may be any, provided that it has a fullerene framework. Examples of the fullerene and the fullerene derivative are fullerene such as $C_{60}$, $C_{70}$, $C_{76}$, $C_{78}$, and $C_{84}$, fullerene oxide being any of these fullerenes whose carbon atoms at least partly are oxidized, a compound in which part of carbon atoms of a fullerene framework is modified by optional functional groups, a compound in which these functional groups are bonded to form a circle, and so on.

Examples of the functional group used for the fullerene derivative are: a hydrogen atom; a hydroxyl group; a halogen atom such as a fluorine atom and a chlorine atom; an alkyl group such as a methyl group and an ethyl group; an alkenyl group such as a vinyl group; a cyano group; an alkoxy group such as a methoxy group and an ethoxy group; an aromatic hydrocarbon group such as a phenyl group and a naphthyl group; an aromatic heterocyclic group such as a thienyl group and a pyridyl group; and so on. Specific examples of the fullerene derivative are fullerene hydride such as $C_{60}H_{36}$ and $C_{70}H_{36}$, fullerene oxide being oxidized $C_{60}$ and $C_{70}$, a fullerene metal complex, and the like. As the fullerene derivative, [6,6]phenylC$_{61}$butyric acid methylester (PC60BM), [6,6]phenylC$_{71}$butyric acid methylester (PC70BM), bis-indeneC$_{60}$ (60ICBA), or the like is preferably used.

The organic active layer 51 has a bulk hetero junction structure containing a mixture of a p-type semiconductor material and an n-type semiconductor material, for instance. The organic active layer 51 of the bulk hetero junction type has a microphase-separated structure of the p-type semiconductor material and the n-type semiconductor material. In the organic active layer 51, a p-type semiconductor phase and an n-type semiconductor phase are separated from each other and form a pn junction on a nano meter order. When the organic active layer 51 absorbs light, positive charges (holes) and negative charges (electrons) are separated on an interface of these phases and they are transported to the electrodes 4, 6 through the respective semiconductors. The organic active layer 51 of the bulk hetero junction type is formed by applying a solution in which the p-type semiconductor material and the n-type semiconductor material are dissolved in a solvent, on the transparent substrate 2 having the transparent electrode 4 and so on. A thickness of the organic active layer 51 is not particularly limited, but is preferably 10 nm to 1000 nm.

In a case where the photoelectric conversion device 1 is applied to an organic/inorganic hybrid photovoltaics, the organic active layer 51 includes, for example, an organic/inorganic hybrid perovskite compound. An example of the organic/inorganic hybrid perovskite compound is a compound having a composition expressed by $CH_3NH_4MX_3$ (M is at least one element selected from lead and tin, and X is at least one element selected from iodine, bromine, and chlorine). Examples of a method of forming the organic active layer 51 are a method of depositing the aforesaid perovskite compound or its precursor by vacuum deposition, and a method of applying a solution in which the perovskite compound or its precursor is dissolved in a solvent, followed by heating and drying. An example of the precursor of the perovskite compound is a mixture of methylammonium halide and lead halide or tin halide. The thickness of the organic active layer 51 is not particularly limited but is preferably 10 nm to 1000 nm.

In a case where the electrons generated in the photoelectric conversion layer 5 are collected in the transparent electrode 4, the first intermediate layer (first buffer layer) 52 is formed of a material capable of selectively and efficiently transporting the electrons. As the constituent material of the first intermediate layer 52 functioning as an electron transport layer, an inorganic material such as zinc oxide, titanium oxide, or gallium oxide, or an organic material such as polyethyleneimine or its derivative is used. The first intermediate layer 52 is formed by, for example, a vacuum deposition method, a sputtering method, an ion plating method, a sol gel method, a plating method, a coating method, or the like. A thickness of the first intermediate layer 52 is preferably not less than 0.05 nm nor more than 200 nm, and more preferably not less than 0.1 nm nor more than 50 nm.

In a case where the holes generated in the photoelectric conversion layer 5 are collected in the counter electrode 6, the second intermediate layer (second buffer layer) 53 is formed of a material capable of selectively and efficiently transporting the holes. As the constituent material of the second intermediate layer 53 functioning as a hole transport layer, an inorganic material such as vanadium oxide, tantalum oxide, or molybdenum oxide, or an organic material such as polythiophene, polypyrrole, polyacetylene, triphenylenediaminepolypyrrol, polyaniline, or a derivative of any of these is used. The second intermediate layer 53 is formed by, for example, a vacuum deposition method, a sputtering method, an ion plating method, a sol gel method, a plating method, a coating method, or the like. A thickness of the second intermediate layer 53 is preferably not less than 0.05 nm nor more than 200 nm, and more preferably not less than 0.1 nm nor more than 50 nm.

The counter electrode 6 is formed of a material having conductivity, and in some case, having a light transmitting property. As the constituent material of the counter electrode 6, metal such as platinum, gold, silver, copper, nickel, cobalt, iron, manganese, tungsten, titanium, zirconium, tin, zinc, aluminum, indium, chromium, lithium, sodium, potassium, rubidium, cesium, calcium, magnesium, barium, samarium, or terbium, an alloy containing any of these, a conductive metal oxide such as an indium-zinc oxide (IZO), a conductive polymer such as PEDOT/PSS, or a carbon material such as graphene is used, for example. A material in which a nano conductive material such as a silver nanowire, a gold nanowire, or a carbon nanotube is mixed in any of the aforesaid materials is also usable.

The counter electrode 6 is formed by, for example, a vacuum deposition method, a sputtering method, an ion plating method, a sol gel method, a plating method, a coating method, or the like. A thickness of the counter electrode 6 is not particularly limited, but preferably is not less than 1 nm nor more than 1 μm. When the film thickness of the counter electrode 6 is too thin, resistance becomes too high, which may make it impossible to sufficiently transmit the generated electric charges to an external circuit. When the thickness of the counter electrode 6 is too thick, its film formation takes a long time and accordingly a material temperature increases, which may damage the organic active layer 51. Sheet resistance of the counter electrode 6 is not particularly limited, but is preferably 500 Ω/□ or less, and more preferably 200 Ω/□ or less. In a case of a device of a current driven type such as a photovoltaics and a light emitting element, the sheet resistance is still more preferably 50 Ω/□ or less.

Figure 3A:
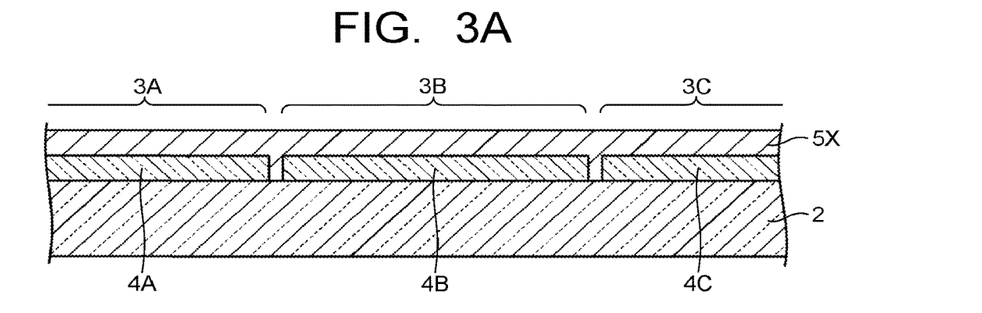
FIG. 3A to FIG. 3C are sectional views schematically illustrating a manufacturing method of the photoelectric conversion device illustrated in FIG. 1.

Manufacturing steps of the photoelectric conversion device 1 in the embodiment will be roughly described with reference to FIG. 3A to FIG. 3C. As illustrated in FIG. 3A, the transparent electrodes 4A, 4B, 4C corresponding to the plural photoelectric conversion parts 3A, 3B, 3C are formed on the transparent substrate 2. The transparent electrode 4B is formed so as to be adjacent to the transparent electrode 4A and so as to be electrically insulated from the transparent electrode 4A. Similarly, the transparent electrode 4C is formed so as to be adjacent to the transparent electrode 4B and so as to be electrically insulated from the transparent electrode 4B. A photoelectric conversion layer 5X is formed above the transparent substrate 2 so as to cover these transparent electrodes 4A, 4B, 4C. The photoelectric conversion layer 5X is formed on the whole surface so as to cover all the transparent electrodes 4A, 4B, 4C.

Figure 3B:
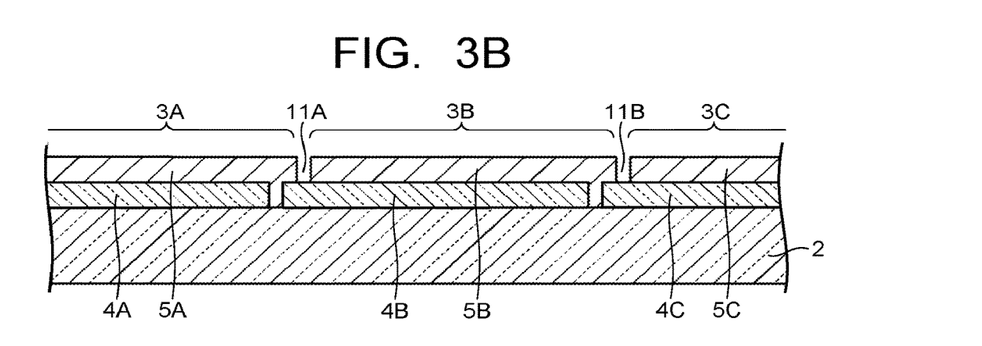

Next, as illustrated in FIG. 3B, the photoelectric conversion layer 5X is scribed, whereby grove portions 11A, 11B are formed so that the photoelectric conversion layer 5X is divided into a plurality of parts corresponding to the respective photoelectric conversion parts 3A, 3B, 3C. The groove portions 11A, 11B dividing the photoelectric conversion layer 5X are formed by, for example, mechanical scribing. By dividing the photoelectric conversion layer 5X into the plural parts by the groove portions 11A, 11B, the photoelectric conversion layers 5A, 5B, 5C corresponding to the plural photoelectric conversion parts 3A, 3B, 3C are formed. The dividing groove portions 11A, 11B are regions where to form connection parts for electrically connecting the counter electrodes 6A, 6B of the photoelectric conversion parts 3A, 3B with the transparent electrodes 4B, 4C of the adjacent photoelectric conversion parts 3B, 3C.

Figure 3C:
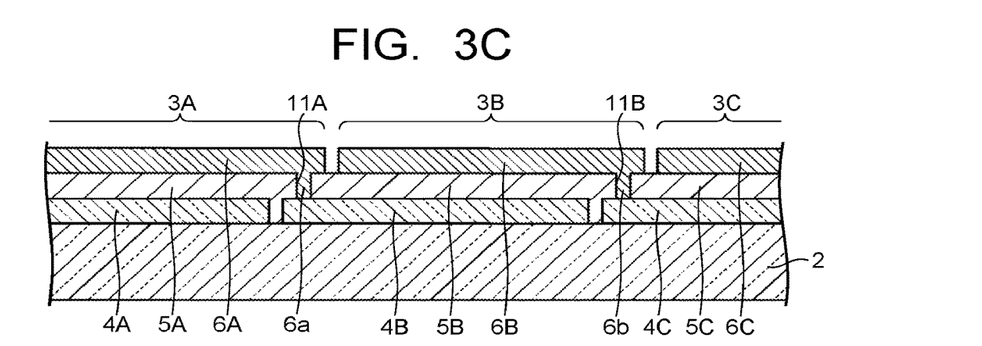

As illustrated in FIG. 3C, the counter electrodes 6A, 6B, 6C corresponding to the plural photoelectric conversion parts 3A, 3B, 3C are formed on the photoelectric conversion layers 5A, 5B, 5C respectively. In forming the counter electrodes 6A, 6B of the photoelectric conversion parts 3A, 3B, parts (counter electrode materials) 6a, 6b of the counter electrodes 6A, 6B are filled in the groove portions 11A, 11B provided between the photoelectric conversion parts 3A, 3B and the adjacent photoelectric conversion parts 3B, 3C. In this manner, the counter electrodes 6A, 6B of the photoelectric conversion parts 3A, 3B are electrically connected with the transparent electrodes 4B, 4C of the adjacent photoelectric conversion parts 3B, 3C via the counter electrode materials 6a, 6b filled in the groove portions 11A, 11B.

Incidentally, in a conventional manufacturing step, in order to electrically connect the counter electrodes 6A, 6B of the photoelectric conversion parts 3A, 3B with the transparent electrodes 4B, 4C of the adjacent photoelectric conversion parts 3B, 3C, surfaces of the transparent electrodes 4B, 4C are exposed in the groove portions 11A, 11B. The groove portions 11A, 11B are formed by mechanical scribing using a cutting tool or the like. In mechanically scribing the photoelectric conversion layer 5X, if a pressure with which the surfaces of the transparent electrodes 4B, 4C are surely exposed is applied, a crack or the like is likely to occur in the transparent electrodes 4B, 4C if the transparent electrodes 4B, 4C are formed of a hard and brittle transparent conductive oxide. Especially when a substrate formed of an organic material is used as the transparent substrate 2, the substrate is compressed to increase a deformation amount of the transparent electrodes 4B, 4C, which is likely to cause a crack or the like. Further, if a conductive polymer equal in softness to the photoelectric conversion layer 5X is used for the transparent electrodes 4B, 4C, the transparent electrodes 4B, 4C are also scribed at the same time when the pressure with which the surfaces of the transparent electrodes 4B, 4C are surely exposed is applied. Further, if the surfaces of the transparent electrodes 4B, 4C are exposed, the transparent electrodes 4B, 4C come into direct contact with the counter electrodes 6 made of silver, aluminum, or the like, which is sometimes likely to cause galvanic corrosion.

On the other hand, if the scribing pressure is decreased in the conventional manufacturing step in order to prevent breakage of the transparent electrodes 4B, 4C, part of the photoelectric conversion layer 5X is likely to remain in the groove portions 11A, 11B. If the soft and viscous photoelectric conversion layer 5X existing on the hard transparent electrodes 4B, 4C formed of the conductive metal oxide is tried to be mechanically scribed, part of the photoelectric conversion layer 5X is likely to remain in the groove portions 11A, 11B. If part of the photoelectric conversion layer 5X remains in the groove portions 11A, 11B, electric resistance between the counter electrodes 6A, 6B of the photoelectric conversion parts 3A, 3B and the transparent electrodes 4B, 4C of the adjacent photoelectric conversion parts 3B, 3C increases, resulting in deterioration of power conversion efficiency.

In the manufacturing method of the photoelectric conversion device 1 of the embodiment, the following structure and step are employed. A connection step of the photoelectric conversion parts 3 in the manufacturing method of the photoelectric conversion device 1 of the embodiment and the structure of the connection part will be described with reference to FIG. 4A to FIG. 4D and FIG. 5A to FIG. 5C. FIG. 4A to FIG. 4D are sectional views illustrating the connection step of the photoelectric conversion parts 3, and FIG. 5A to FIG. 5C are plane views illustrating the connection step of the photoelectric conversion parts 3. Note that FIG. 4A to FIG. 4D and FIG. 5A to FIG. 5C illustrate the connection step of the photoelectric conversion part 3A and the photoelectric conversion part 3B adjacent thereto. The connection step of the photoelectric conversion part 3B and the photoelectric conversion part 3C adjacent thereto is also executed in the same manner. The same applies to a case where the photoelectric conversion device 1 has four or more photoelectric conversion parts 3, and the adjacent photoelectric conversion parts 3 are serially connected in sequence by the same step.

Figure 4A:
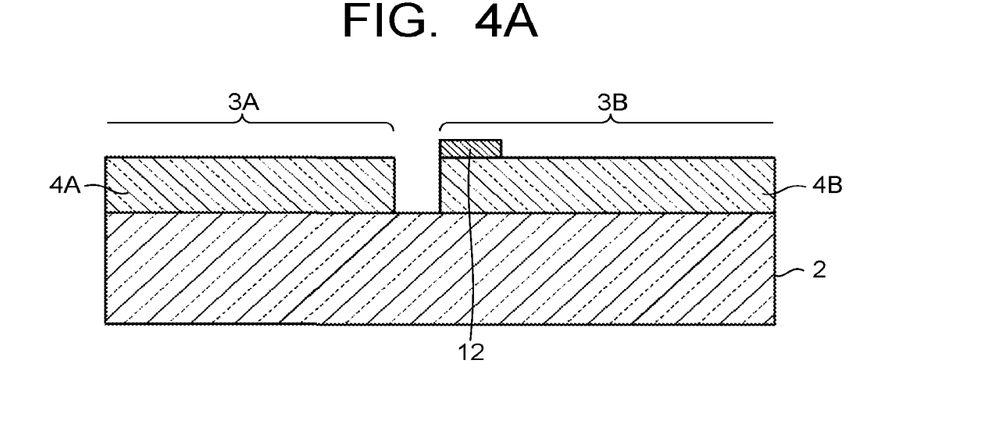
FIG. 4A to FIG. 4D are sectional views illustrating a connection step of the photoelectric conversion parts in the manufacturing method of the photoelectric conversion device of the embodiment and the structure of a connection part.
Figure 5A:
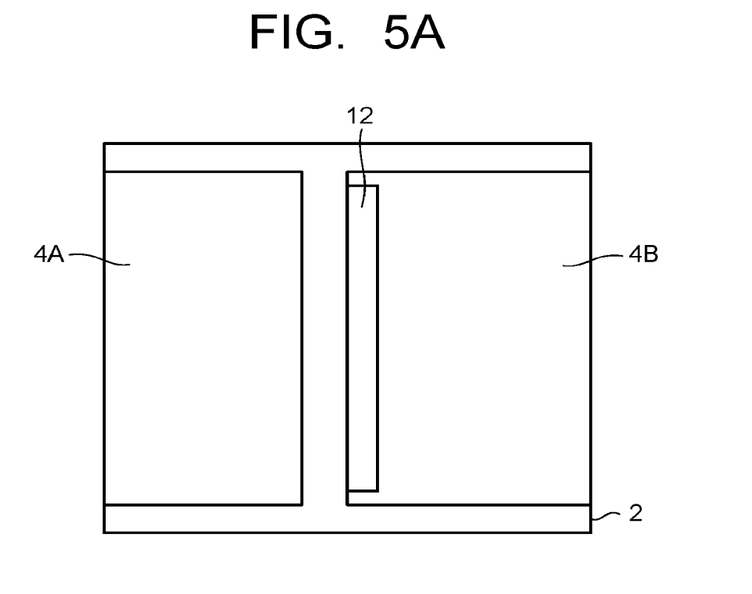
FIG. 5A to FIG. 5C are plane views illustrating the connection step of the photoelectric conversion parts in the manufacturing method of the photoelectric conversion device of the embodiment.
Figure 5B:
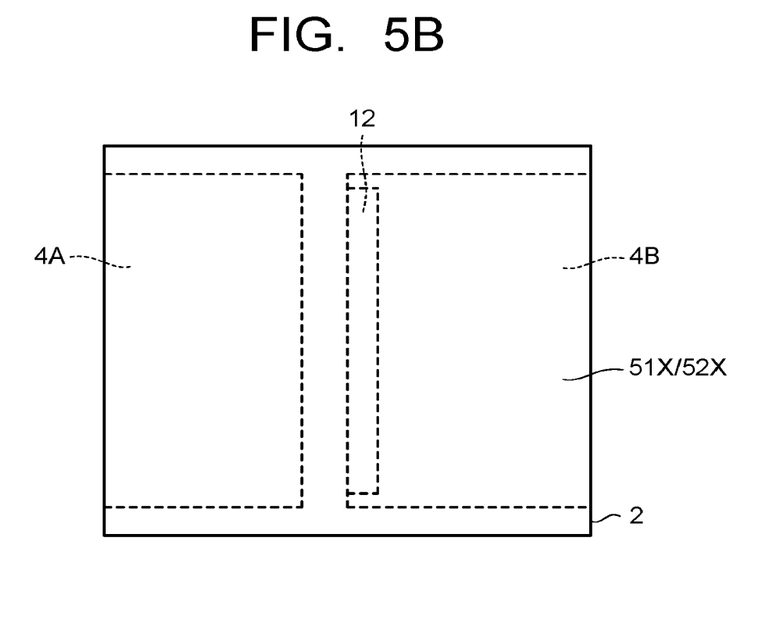
Figure 5C:
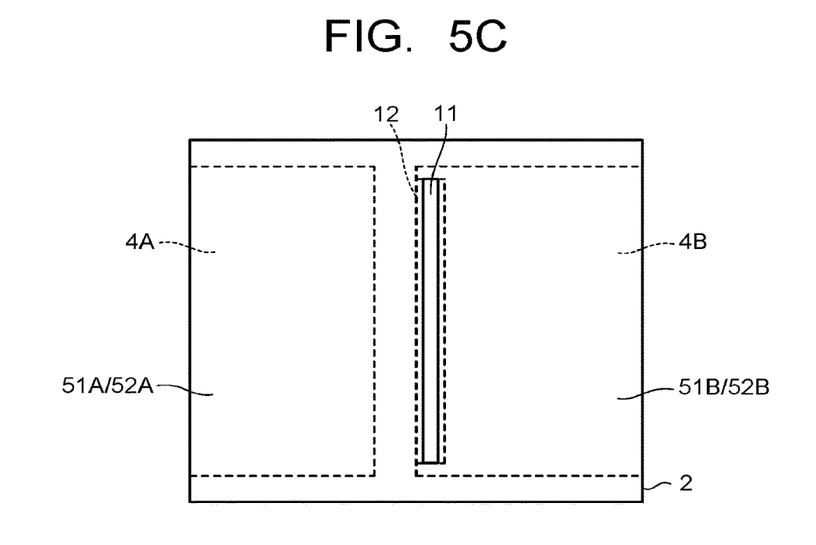

As illustrated in FIG. 4A and FIG. 5A, a conductive layer 12 is formed on the transparent electrode 4B of the photoelectric conversion part 3B with which the counter electrode 6A of the photoelectric conversion part 3A is electrically connected. The conductive layer 12 functions as a formation region of the groove portion 11A and as a protective layer for the transparent electrode 4B when the photoelectric conversion layer 5X is mechanically scribed. Therefore, the conductive layer 12 is formed only on a region, of the transparent electrode 4B, corresponding to a scribe region of the photoelectric conversion layer 5X. The conductive layer 12 is formed only on a partial region, of the transparent electrode 4B, which is adjacent to the transparent electrode 4A. The conductive layer 12 has a metal material layer formed of metal such as aluminum, gold, platinum, silver, copper, indium, bismuth, lead, tin, zinc, iron, cobalt, nickel, titanium, zirconium, molybdenum, tungsten, chromium, and tantalum, or an alloy containing any of these, a carbon material layer of graphene or the like, or a composite material layer in which particles and fibers of the aforesaid metal material or carbon material are dispersed in a polymer material (a metal/polymer composite material layer or a carbon/polymer composite material layer). The conductive layer 12 may be a metal material layer in which a plurality of metal layers are stacked, or may be a film stack of a metal material layer and a carbon material layer or the like.

Figure 4B:
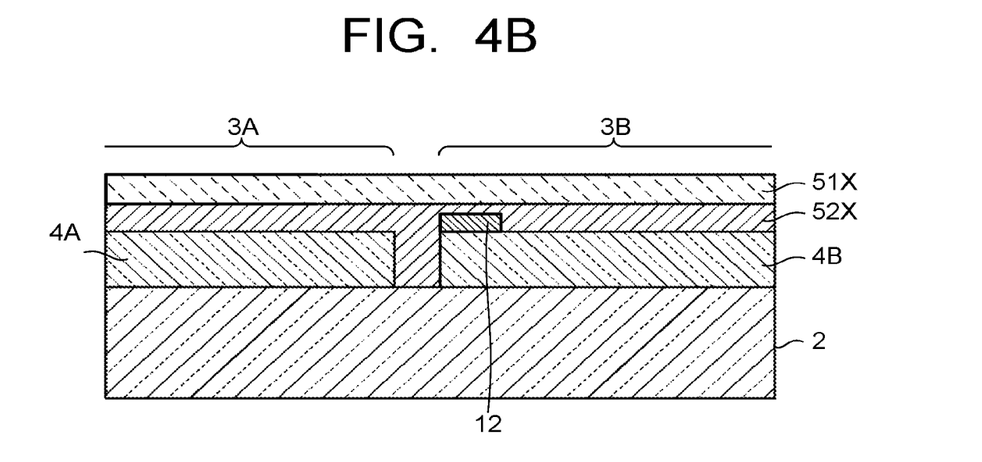
Figure 4C:
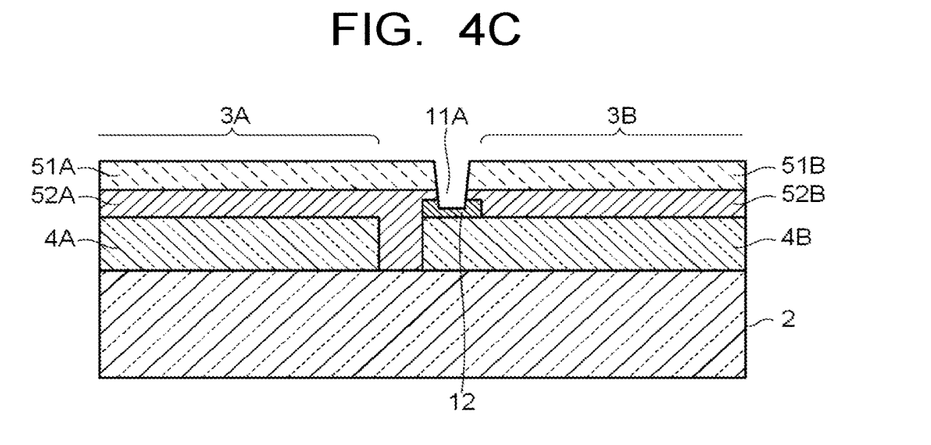

Next, as illustrated in FIG. 4B and FIG. 5B, a first intermediate layer 52X and an organic active layer 51X are sequentially formed above the transparent substrate 2 so as to cover the transparent electrode 4A and the transparent electrode 4B including the conductive layer 12. Subsequently, as illustrated in FIG. 4C and FIG. 5C, the film stack of the first intermediate layer 52X and the organic active layer 51X is scribed along the formation region of the conductive layer 12, whereby the groove portion 11A is formed. The groove portion 11A is formed by the mechanical scribing of the film stack of the first intermediate layer 52X and the organic active layer 51X as previously described. In the mechanical scribing of the film stack, a part of the conductive layer 12 in terms of a thickness direction is scribed out together with the film stack. The groove portion 11A reaches an inside of the conductive layer 12 and does not reach substantially the transparent electrode 4B.

By scribing the soft and viscous first intermediate layer 52X and organic active layer 51X together with a part of the conductive layer 12 as previously described, it is possible to prevent the first intermediate layer 52X and the organic active layer 51X from partly remaining in the groove portion 11A. The groove portion 11A formed by such a mechanical scribing step has a shape reaching an inside (thicknesswise middle portion) of the conductive layer 12 from a surface of the film stack of the first intermediate layer 52X and the organic active layer 51X. The film stack of the first intermediate layer 52X and the organic active layer 51X is divided into a plurality of parts by the groove portion 11A reaching the inside of the conductive layer 12, so that the organic active layers 51A, 51B having the first intermediate layers 52A, 52B are formed so as to correspond to the photoelectric conversion parts 3A, 3B.

Figure 4D:
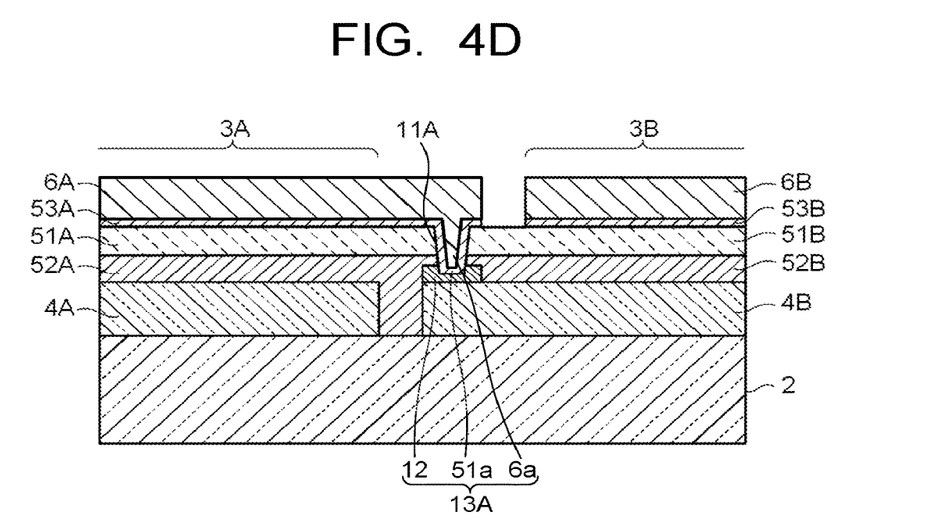

Next, as illustrated in FIG. 4D, the second intermediate layers 53A, 53B and the counter electrodes 6A, 6B corresponding to the respective photoelectric conversion parts 13A, 3B are sequentially formed on the organic active layers 51A, 51B. In forming the second intermediate layer 53A and the counter electrode 6A of the photoelectric conversion part 3A, part (second intermediate layer material) 53a of the second intermediate layer 53A and part (counter electrode material) 6a of the counter electrode 6A are filled in the groove portion 11A provided between the photoelectric conversion part 3A and the adjacent photoelectric conversion part 3B. In this manner, the counter electrode 6A of the photoelectric conversion part 3A is electrically connected with the transparent electrode 4B of the adjacent photoelectric conversion part 3B by a connection part 13A having the conductive layer 12 and having the second intermediate layer material 53a and the counter electrode material 6a which are filled in the groove portion 11A. It should be noted that the second intermediate layer material 53a in the groove portion 11A is not essential but may be formed only in a region other than the groove portion 11A.

Considering the function as the formation region (scribing region) of the groove portion 11A at the time of the mechanical scribing, the conductive layer 12 is preferably formed of a metal material relatively low in hardness such as aluminum, gold, platinum, silver, copper, indium, bismuth, lead, tin, zinc, iron, cobalt, or nickel, or a material (first conductive material) in which particles or fibers of a metal material or a carbon material are dispersed in a binder such as a resin. Incidentally, even if the conductive layer 12 is formed of a metal material (second conductive material) relatively high in hardness such as iron, cobalt, nickel, titanium, zirconium, molybdenum, tungsten, chromium, or tantalum, it is more excellent in toughness and so on than the conductive metal oxide being the forming material of the transparent electrode 4, and thus can be scribed without any occurrence of a crack or the like at the time of the mechanical scribing. Therefore, even the conductive layer 12 formed of the second conductive material can function as the scribing region at the time of the mechanical scribing.

Figure 6:
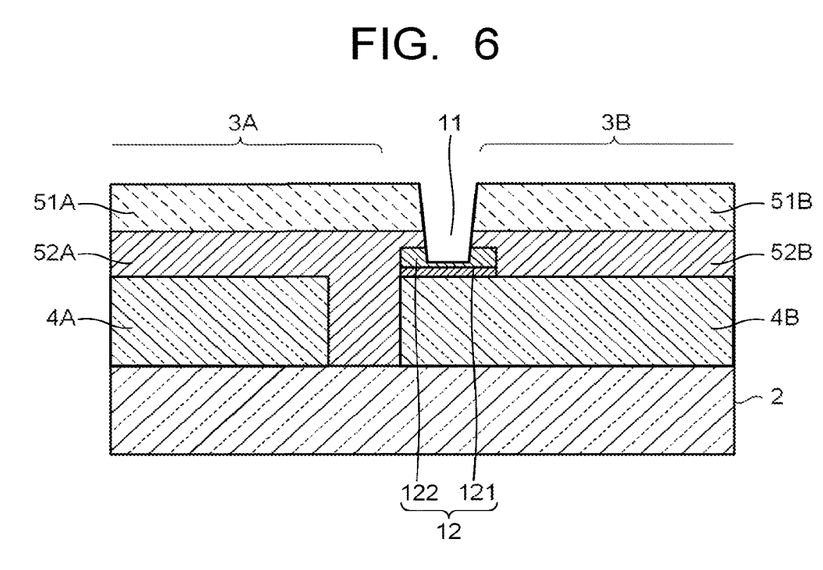
FIG. 6 is a sectional view illustrating another structure example of the connection part in the photoelectric conversion device of the embodiment.

On the other hand, considering the function as the protective layer for the transparent electrode 4B, the conductive layer 12 is preferably formed of the second conductive material relatively high in hardness such as iron, cobalt, nickel, titanium, zirconium, molybdenum, tungsten, chromium, and tantalum. Taking these points into consideration, the conductive layer 12 may have: a first conductive layer 121 formed of the aforesaid second conductive material and provided on the transparent electrode 4B; and a second conductive layer 122 formed of the aforesaid first conductive material and provided on the first conductive layer 121 as illustrated in FIG. 6.

As described above, the conductive layer 12 may include a plurality of constituent layers. The constituent layers of the conductive layer 12 each are not limited to the aforesaid metal material layer, and may be a carbon material layer or a material layer in which particles or fibers of a metal material or a carbon material are dispersed in a binder such as a resin. Out of these plural constituent layers, the constituent layer in contact with the second transparent electrode (for example, the first conductive layer 121) preferably has higher Vickers hardness than that of the other constituent layers (for example, the second conductive layer 122). Employing the conductive layer 12 having such plural constituent layers makes it possible to favorably achieve both the functions as the scribing region at the time of the mechanical scribing and the protective layer for the transparent electrode 4B. Further, the conductive layer 12 may have three constituent layers or more. An example of a specific structure in this case is a film stack having a high-hardness constituent layer, a low-hardness constituent layer, and a high-hardness constituent layer which are formed sequentially on the transparent electrode 4B.

The conductive layer 12 forms part of the connection part 13A. That is, the counter electrode 6A of the photoelectric conversion part 3A is electrically connected with the transparent electrode 4B of the adjacent photoelectric conversion part 3B via the conductive layer 12. Considering the function of the conductive layer 12 as the electrical connection part, the conductive layer 12 is preferably formed of metal such as aluminum, gold, silver, copper, or molybdenum, or an alloy containing any of these metals. However, even a conductive material relatively low in conductivity (tin, chromium, titanium, or the like, or a material in which particles or fibers of a metal material or a carbon material are dispersed in a binder such as a resin) is usable as the conductive layer 12 if its thickness is made thin within a range not impairing the functions of the conductive layer 12 as the scribing region and the protective layer.

According to the photoelectric conversion device 1 of the embodiment and the manufacturing method thereof, it is possible to prevent part of the organic active layer 51 and so on from remaining in the groove portion 11 without breaking the transparent electrode 4 at the time of the mechanical scribing. Therefore, it is possible to improve electrical connectivity between the adjacent photoelectric conversion parts 3. Specifically, it is possible to reduce connection resistance between the counter electrode 6A of the photoelectric conversion part 3A and the transparent electrode 4B of the adjacent photoelectric conversion part 3B. An increase of the connection resistance between the photoelectric conversion parts 3 becomes a cause to deteriorate power conversion efficiency of the photoelectric conversion device 1. According to the photoelectric conversion device 1 of the embodiment and the manufacturing method thereof, it is possible to improve the power conversion efficiency. In particular, even when the number of the serially connected photoelectric conversion parts 3 is increased, by reducing a probability of an increase of the connection resistance between the adjacent photoelectric conversion parts 3, it is possible to enhance the power conversion efficiency as the whole device.

EXAMPLES

Next, examples and their evaluation results will be described.

Example 1

First, a plurality of ITO films each with a 150 nm thickness were formed as transparent electrodes, on a resin film with a 200 μm thickness formed of polyethylene terephthalate. The plural ITO films were formed according to the number of photoelectric conversion parts installed. Next, edge portions of the plural ITO films were coated with silver paste, followed by drying, whereby conductive layers were formed. A width and a thickness of the conductive layers were set to about 0.5 mm and about 5 μm respectively.

Ethoxylated polyethyleneimine (80% ethoxylated (PETE)) was formed into a film with an about 1 nm thickness as a transparent electrode-side first intermediate layer, above the resin film having the plural ITO films and the conductive layers provided only on partial regions thereof. Next, a coating solution (a coating solution of an organic active layer) in which 8 mg PTB7 (poly{4,8-bis[(2-ethylhexyl)oxy]benzo[1,2-b:4,5-b']dithiophene-2,6-diyl-alt-3-fluoro-2-[(2-ethylhexyl)carbonyl]thieno[3,4-b]thiophene-4,6-diyl}) and 12 mg PC70BM ([6,6]-phenyl C71 butyric acid methyl ester) were dispersed in 1 mL monochlorobenzene was applied on the first intermediate layer by a meniscus coating method. A coating condition was set as follows. A coating head (made of SUS303) with a 303 mm width was disposed above the resin film at a 0.88 mm gap. Between the resin film and the coating head, the coating solution in a 1.38 mL amount was supplied by using a syringe pump. The coating solution was applied while the resin film was moved at a 10 mm/s speed. A coating film was dried at 60° C. for 30 minutes, whereby an organic active layer having an about 100 nm thickness was formed.

Next, the organic active layer was mechanically scribed along formation regions of the conductive layers, together with part of the conductive layers, whereby the conductive layers were exposed. As a scribing tool, a general-purpose cutter was used. The cutter was pressed by a suspension mechanism using a spring with an about 1.96 N force and was scanned in parallel to a longitudinal direction of the conductive layers, thereby scribing out the organic active layer. At this time, parts of the conductive layers were also scribed out, but the ITO films were not exposed. An exposure width of each of the conductive layers was about 20 μm.

Thereafter, on the organic active layer, molybdenum trioxide was formed into a film with an about 5 nm thickness as a counter electrode-side second intermediate layer, and further silver was formed into films with an about 150 nm thickness as counter electrodes. When power conversion efficiency of an organic photovoltaic module obtained in this manner was measured by using a solar simulator with 1.5 G air mass (AM) and 1000 W/m² irradiance, the power conversion efficiency was a good value of 7.1%.

Example 2

An organic photovoltaic module was fabricated in the same manner as in Example 1 except in the following points. As a transparent substrate, a glass substrate was used. As conductive layers, a film stack of a Mo alloy (thickness: 50 nm)/an Al alloy (thickness: 200 mm)/a Mo alloy (thickness: 50 nm) was used. The film stack was patterned by a photolithography method. In a mechanical scribing step, a suspension mechanism using a spring with an about 4.9 N force was used. In the mechanical scribing step, part of the film stack was also scribed out, but ITO films were not exposed. An exposure width of the film stack was about 20 μam. When power conversion efficiency of the organic photovoltaic module obtained in this manner was measured in the same manner as in Example 1, the power conversion efficiency was a good value of 7.5%.

Comparative Example 1

An organic photovoltaic module was fabricated in the same manner as in Example 1 except that conductive layers were not formed on transparent electrodes. When a pressing force of a cutter in a mechanical scribing step was set to about 1.96 N as in Example 1, ITO films cracked and broken pieces were produced. When the pressing force of the cutter was up to about 1.18 N, a crack was confirmed in the ITO films. When the pressing force of the cutter was decreased to about 0.98 N, there was no broken piece of the ITO films. However, when power conversion efficiency of this organic photovoltaic module was measured in the same manner as in Example 1, the power conversion efficiency was 3.5% and thus inferior to that of Example 1. It is inferred that this is because, out of measurement values, series resistance Rs is larger as compared with Example 1 and accordingly an organic active layer partly remains in scribe grooves, and this serves as resistance and does not allow sufficient series connection between cells.

Comparative Example 2

An organic photovoltaic module was fabricated in the same manner as in Example 2 except that conductive layers were not formed on transparent electrodes. When a pressing force of a cutter in a mechanical scribing step was set to about 4.9 N as in Example 2, there was no broken piece of ITO films. However, when power conversion efficiency of this organic photovoltaic module was measured in the same manner as in Example 2, the power conversion efficiency was 6.5% and thus inferior to that of Example 2. It is inferred that this is because, out of measurement values, series resistance Rs is larger as compared with Example 2 and accordingly an organic active layer partly remains in scribe grooves, and this serves as resistance and does not allow sufficient series connection between cells. Further, it was confirmed that an exposure width of a film stack was about 10 μm at a starting position of the scribing and was narrower than that in Example 2. An exposure width of the film stack at an end position of the scribing was increased to about 25 μm, and abrasion of a blade edge of a cutter was confirmed. Accordingly, even when the pressing force of the cutter was adjusted, compatibility of power conversion efficiency and lifetime of the cutter was inferior as compared with Example 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The inventions described in the accompanying claims and their equivalents are intended to cover such forms or modifications as would fall within the scope and spirit of the inventions.

What is claimed is:

1. A manufacturing method of a photoelectric conversion device, comprising:
    forming, on a transparent substrate, a first transparent electrode and a second transparent electrode adjacent to the first transparent electrode and physically separated from the first transparent electrode;
    forming a conductive layer entirely on only a partial region of the second transparent electrode;
    forming an active layer above the transparent substrate after the conductive layer is formed so as to cover the conductive layer, the first transparent electrode, and the second transparent electrode;
    scribing the active layer with only a part of the conductive layer along a formation region of the conductive layer to form a groove penetrating the active layer while partially penetrating into the conductive layer; and
    forming a first counter electrode and a second counter electrode on the active layer divided by the groove so as to correspond to the first transparent electrode and the second transparent electrode, each of the first and second counter electrodes being made of an electrode material,
    wherein the electrode material of the first counter electrode is filled in the groove to electrically connect the first counter electrode and the second transparent electrode via the conductive layer.

2. The manufacturing method of claim 1, wherein the groove is formed by mechanical scribing of the active layer with only the part of the conductive layer.

3. The manufacturing method of claim 1, wherein the conductive layer has at least one layer selected from:
    a metal material layer containing at least one element selected from a group consisting of aluminum, gold, platinum, silver, copper, indium, bismuth, lead, tin, zinc, iron, cobalt, nickel, titanium, zirconium, molybdenum, tungsten, chromium, and tantalum;
    a carbon material layer;
    a metal/polymer composite material layer in which powder of the metal is dispersed in a polymer material; and
    a carbon/polymer composite material layer in which powder of the carbon material is dispersed in a polymer material.

4. The manufacturing method of claim 1, wherein the first and second transparent electrodes each contain at least one material selected from indium oxide, zinc oxide, tin oxide, indium tin oxide, fluorine-doped tin oxide, gallium-doped zinc oxide, aluminum-doped zinc oxide, indium-zinc oxide, indium-gallium-zinc oxide, poly(3,4-ethylenedioxythiophene)/poly(4-styrenesulfonic acid), and graphene.

5. The manufacturing method of claim 3,
    wherein the conductive layer includes a plurality of constituent layers selected from the metal material layer, the carbon material layer, the metal/polymer composite material layer, and the carbon/polymer composite material layer,
    wherein the plurality of constituent layers includes a first constituent layer in contact with the second transparent electrode and a second constituent layer provided on the first constituent layer, and
    wherein the first constituent layer is higher in Vickers hardness than the second constituent layer.

6. The manufacturing method of claim 1, wherein the conductive layer includes: a first conductive layer containing at least one element selected from the group consisting of iron, cobalt, nickel, titanium, zirconium, molybdenum, tungsten, chromium, and tantalum and provided on the second transparent electrode; and a second conductive layer containing at least one element selected from a group consisting of aluminum, gold, platinum, silver, copper, indium, bismuth, lead, tin, and zinc, and provided on the first conductive layer.

* * * * *